United States Patent [19]

Suzuki et al.

[11] Patent Number: 5,153,815
[45] Date of Patent: Oct. 6, 1992

[54] COOLING STRUCTURE OF A TEST HEAD FOR IC TESTER

[75] Inventors: Shinya Suzuki; Seiichi Hirose, both of Tokyo, Japan

[73] Assignee: Ando Electric Co., Ltd., Tokyo, Japan

[21] Appl. No.: 632,335

[22] Filed: Dec. 21, 1990

[30] Foreign Application Priority Data

Dec. 21, 1989 [JP] Japan .................................. 1-332371

[51] Int. Cl.⁵ .............................................. H05K 7/20
[52] U.S. Cl. ...................................... 361/386; 361/381; 361/382; 361/389; 174/16.3; 165/80.3; 357/82
[58] Field of Search ............... 361/381, 382, 385, 386, 361/389, 380; 174/16.3; 165/80.3, 80.4, 80.5, 185; 357/81, 82

[56] References Cited

U.S. PATENT DOCUMENTS

| | | | |
|---|---|---|---|
| 4,590,538 | 5/1986 | Cray, Jr. | 361/385 |
| 4,712,158 | 12/1987 | Kikuchi et al. | 361/385 |
| 4,825,337 | 4/1989 | Karpman | 361/386 |
| 4,880,050 | 11/1989 | Nakamura et al. | 165/41 |
| 4,931,905 | 6/1990 | Cirrito et al. | 361/385 |
| 4,962,444 | 10/1990 | Niggemann | 361/382 |

Primary Examiner—Leo P. Picard
Assistant Examiner—Young S. Whang
Attorney, Agent, or Firm—Flynn, Thiel, Boutell & Tanis

[57] ABSTRACT

There is disclosed a cooling structure of a test head for IC tester capable of effectively cooling ICs mounted on printed boards. The ICs can be cooled by providing a hinge between the printed boards disposed around a pipe, retaining cooling plates having a conduit by the hinge and flowing fluid having a large specific heat such as water into the conduit.

3 Claims, 5 Drawing Sheets

5,153,815

COOLING STRUCTURE OF A TEST HEAD FOR IC TESTER

BACKGROUND OF THE INVENTION

1. Field of the Invention

The present invention relates to a cooling structure of a test head for IC tester.

2. Prior Art

A prior art arrangement of a cooling structure of a test head for IC tester will be described with reference to FIG. 12.

In FIG. 12, the cooling structure comprises a hollow pipe 11 disposed at the central portion of the test head, a plurality of printed boards 13 disposed radially around the hollow pipe 11, blowers 14 disposed at four courners of the test head, air ventilators 15 disposed at four courners of the test head and a case 16 housing the test head.

ICs are mouted on each of the printed boards 13. The ICs to be tested are normally placed on the central portion of the test head. The printed boards are disposed radially around the pipe 11 so that the distance between each pin of the ICs to be tested and the ICs mounted on each of the printed boards 13 is shortened and spaced for the same interval.

A main portion of the structure in FIG. 12 will be described with reference to FIG. 13.

Inasmuch as the blower 14 rotates so as to to blow the air outside the case 16, the air is sucked from the upper or the lower side of the tube 11 into the printed board 13 through a ventilation hole 17 of the tube 11 and passes out of the case 16.

When the air passes through the printed board 13, the IC mounted on the printed board is cooled.

The numbers of ICs to be mounted on the printed board have been increased and the printed board per se has been of high integration density recently. However, since the cooling structure in FIG. 12 adopts the air cooled type, the air ventilation is deteriorated and the cooling efficiency is not improved. There has been a case that the use of blower 14 is limited because of the environment problem, i.e. noise, vibration, dust and the like caused by the blower 14. Hence, there has been needed the cooling structure without using the blower 14.

SUMMARY OF THE INVENTION

It is therefore an object of the present invention to provide a cooling structure of a test head for IC tester capable of cooling ICs mounted on printed boards by providing a hinge between the printed boards disposed around a pipe 11, retaining cooling plates having a conduit by the hinge and flowing fluid having a large specific heat such as water into the counduit.

To achieve the object of the present invention, a first aspect of the present invention is to provide a cooling structure for a test head of IC tester comprising a pipe 11 disposed at central portion of the test head, a plurality of printed boards 13 disposed radially around the pipe 11 and each provided with a plurality of ICs 12, the cooling structure further comprising a hinge 1 fixed between a plurality of printed boards 13, a plurality of paired cooling plates 3 retained by the hinge 1 at one end thereof and each provided with a conduit 2, and a plurality of thermal conductive plates 5 each provided with a plurality of elastic projections 4, characterized in cooling the ICs 12 by interposing the thermal conductive plate 5 between the paired cooling plates 3 and ICs 12 for thereby rendering the ICs 12 to contact the cooling plates 3 by way of projections 4 and flowing liquid having a high specific heat to the conduit 2.

A cooling structure of a test head for IC tester according to a second aspect of the present invention comprises a pipe 11 disposed at central portion of the test head, a plurality of printed boards 13 disposed radially around the pipe 11 and each provided with a plurality of ICs 12, the cooling structure further comprising a hinge 1 fixed between a plurality of printed boards 13, a plurality of paired cooling plates 3 retained by the hinge 1 at one end thereof and each provided with a conduit 2, and a plurality of thermal conductive plates 5 each provided with a plurality of elastic projections 4, and a pair of air cushions 7 each interposed between paired cooling plates 3 and provided with an air inlet 6, characterized in cooling the ICs 12 by expanding the air cushion 7 by the introduction of the air therein, interposing the thermal conductive plate 5 between the paired cooling plates 3 and ICs 12 for thereby rendering the ICs 12 to contact the cooling plates 3 by way of projections 4 and flowing liquid having a high specific heat to the conduit 2.

A cooling structure of a test head for IC tester according to a third aspect of the present invention comprises a pipe 11 disposed at central portion of the test head, a plurality of printed boards 13 disposed radially around the pipe 11 and each provided with a plurality of ICs 12, the cooling structure further comprising a hinge 1 fixed between a plurality of printed boards 13, a plurality of paired cooling plates 3 retained by the hinge 1 at one end thereof and each provided with a conduit 2, and a plurality of thermal conductive plates 5 each provided with a plurality of elastic projections 4, a plurality of fixing tables 8 each interposed between the paired cooling plates 3, a plurality of wedge-shaped presser plates 9 each interposed between the paired cooling plates 3, and a plurality of levers 10 each connecting the fixing plate 8 to the presser plate 9, characterized in cooling the ICs 12 by pressing the presser plate 9 toward the paired cooling plates 3 by the rotation of the lever 10 to expand the interval between the paired cooling plates 3, interposing the thermal conductive plate 5 between the paired cooling plates 3 and ICs 12 for thereby rendering the ICs 12 to contact the cooling plates 3 by way of projections 4 and flowing liquid having a high specific heat to the conduit 2.

The above and other objects, features and advantages of the present invention will become more apparent from the following description taken in conjunction with the accompanying drawings.

PREFERRED EMBODIMENT OF THE INVENTION

First Embodiment (FIGS. 1 to 4)

An arrangement of a cooling structure of a test head for IC tester according to the first embodiment of the present invention will be described with reference to FIGS. 1 to 4.

Designated at 1 is a hinge, 3 is a cooling plate, 12 is an IC to be cooled and 18 is an inlet pipe. The hinge 1 is fixed between the printed boards 13.

Figure 2:
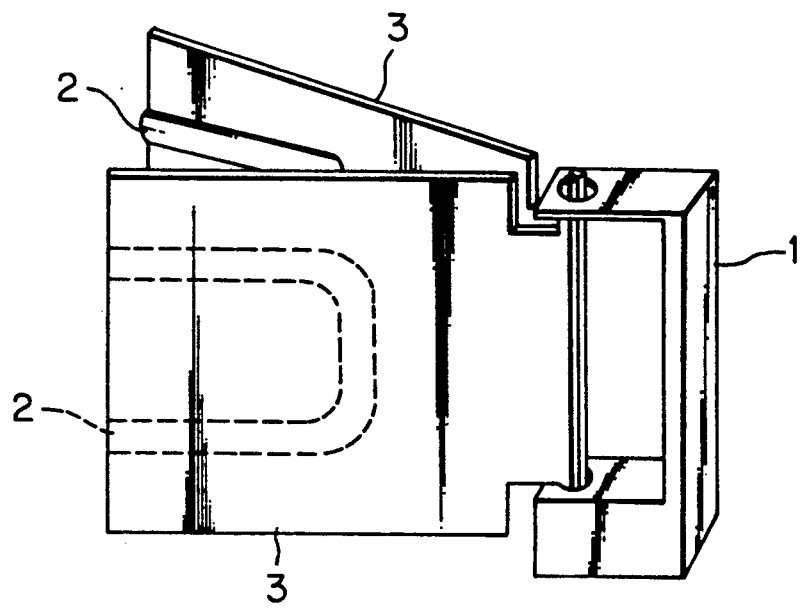
FIG. 2 is a view explaining a relation between a hinge and a pair of cooling plates each constituent of FIG. 1.

A relation between the hinge 1 and the paired cooling plates 3 is described with reference to FIG. 2.

Figure 1:
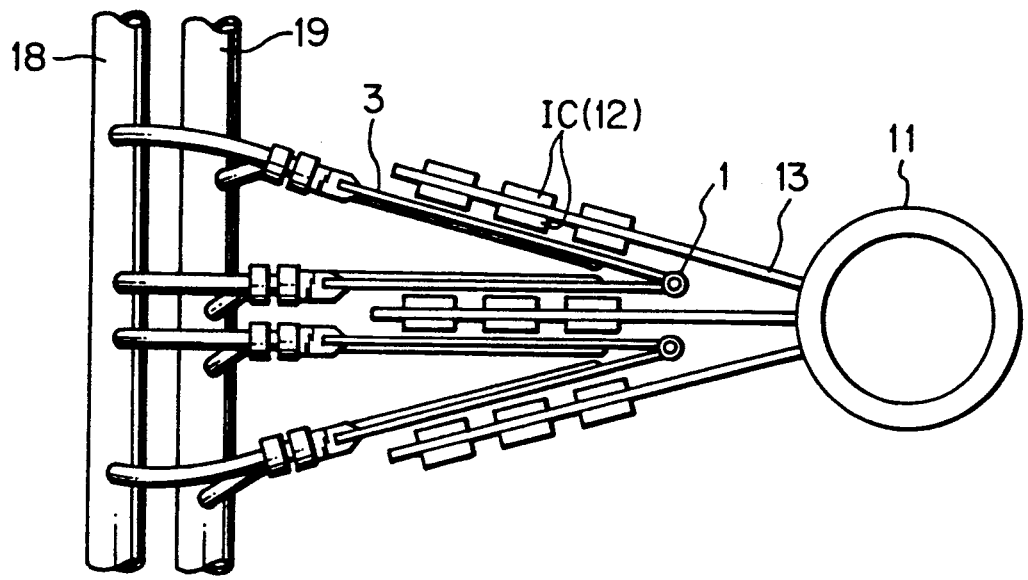
FIG. 1 is a view of assistance in explaining a main portion of a cooling structure of a test head for IC tester according to a first embodiment of the present invention.

The hinge 1 has holes at the upper and lower portions thereof and the paired cooling plates 3 each have projections at the rear portion thereof which can be inserted into the holes of the hinge 1. When the projections of the cooling plates 3 are inserted into the hole of the hinge 1 the cooling plates 3 can be retained by the hinge 1 and opened or closed at the front portions thereof. The paired cooling plates 3 are provided with conduits 2. Fluid having a large specific heat such as water flows into the conduits 2 from the inlet pipe 18 as shown in FIG. 1.

Figure 3:
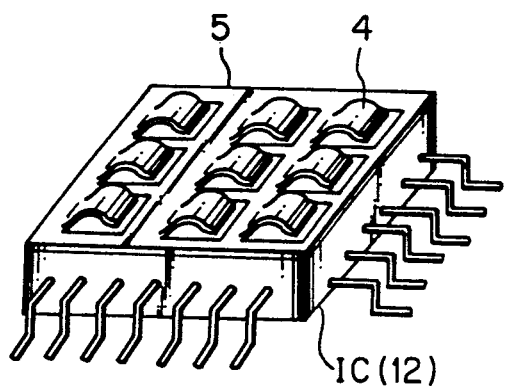
FIG. 3 is a view showing a thermal conductive plate, a constituent of FIG. 1.

An arrangement of the thermal conductive plate will be described with reference to FIG. 3.

Designated at 4 is a projection, 5 is a thermal conductive plate and 12 is an IC to be tested.

The projections 4 are formed to be elastic and may be embossed by a mold. The thermal conductive plate 5 contacts the IC at the portion opposite the projections 4.

An arrangement of the cooling structure of a test head of IC tester according to the first embodiment of the present invention will be described with reference to FIG. 4.

Figure 4:
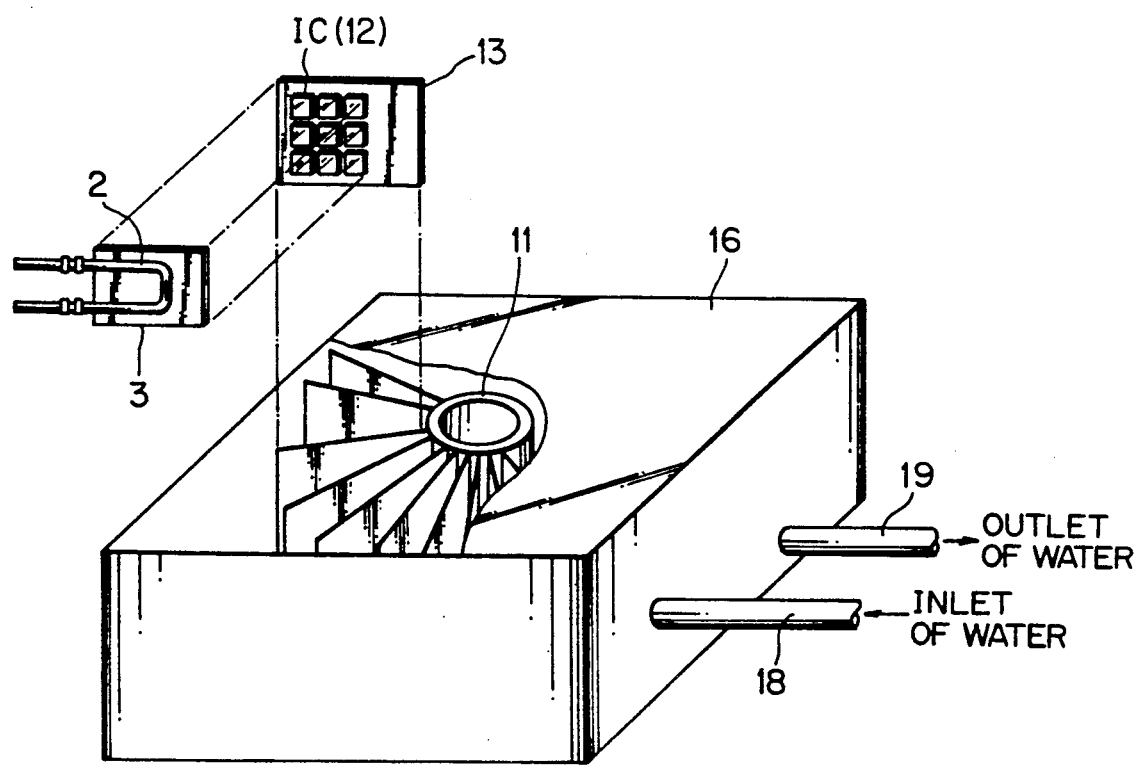
FIG. 4 is a view of assistance in explaining an overall arrangement of a cooling structure of a test head for IC tester according to the first embodiment of the present invention.

In FIG. 4, same as the prior art cooling structure, the pipe 11 is disposed at the central portion of the test head and the plurality of printed boards 13 are arranged radially around the pipe 11. The hinge 1 is fixed between the printed boards 13. The paired cooling plates 3 are retained by the hinge 1 at the one ends thereof and the thermal conductive plate 5 is inserted or interposed between the paired cooling plates 3 and the IC 12. When the paired cooling plates 3 are opened the paired cooling plates 3 contact the IC 12 by way of the projections 4. At this state, the cooled water is introduced into the conduits 2 of the paired cooling plates 3 from inlet pipe 18 and the water heated by the IC 12 is discharged from an outlet pipe 19. The material other than the IC 12 can be cooled, if it contacts the cooling plates 3 as shown in FIG. 1.

Figure 5:
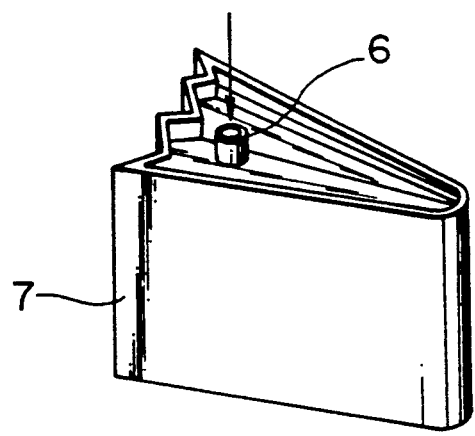
FIGS. 5 to 7 are views of assistance in explaining an arrangement of a cooling structure of a test head for IC tester according to a second embodiment of the present invention.
Figure 6:
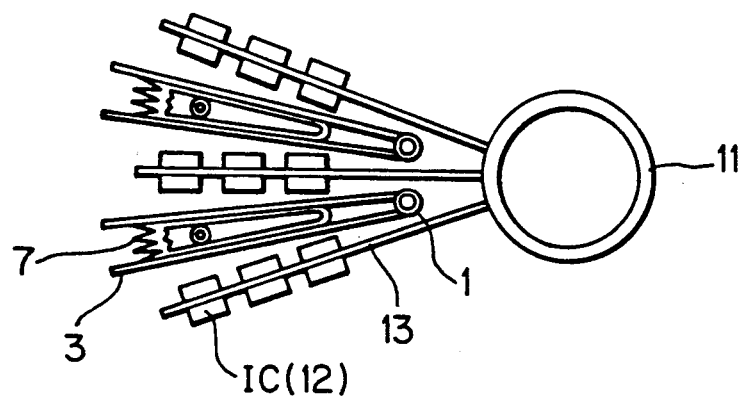
Figure 7:
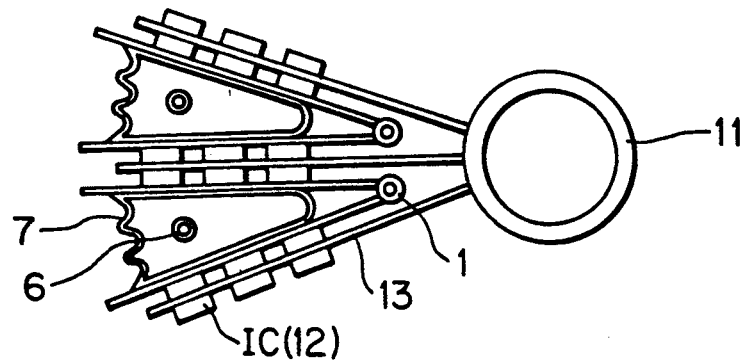

Second Embodiment (FIGS. 5 to 7)

A cooling structure of a test head for IC tester according to a second embodiment will be described with reference to FIGS. 5 to 7.

The second embodiment adopts an air pressurized cooling plate 3. Designated at 6 is an air inlet and 7 is a contractible air cushion.

The air cushion 7 is wedge shaped and expands when the air is introduced from the air inlet 6. The air cushion 7 is formed of a e.g. contractible vinyl chloride.

FIG. 6 shows a state where the air cushion 7 is inserted or interposed between paired cooling plates 3 but is contracted because the air under pressere is not introduced into the air cushion 7. At this state, the paired plates 3 can be detached from the IC.

FIG. 7 shows a state where the air under pressure is introduced into the air cushion at the state of FIG. 6 so that the air cushion 7 is expanded and the paired cooling plates 3 can contact the IC 12 with the aid of the air under pressure.

With the arrangement of the cooling structure according to the second embodiment, the contact pressure between the paired colling plates 3 and the IC 12 can be regulated by the air under pressure so that the uniform contact pressure can be obtained, thereby reducing the distortion of the cooling plates 3 and the printed boards 13.

Third Embodiment (FIGS. 8 to 11)

A cooling structure of a test head for IC tester according to a third embodiment will be described with reference to FIGS. 8 to 11.

The third embodiment adopts cooling plates 3 openable by a lever 10, i.e. the paired cooling plates 3 can be opened or closed by the lever 10.

Figure 8:
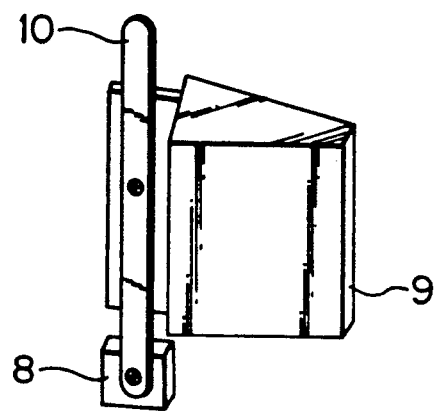
FIGS. 8 to 11 are views of assistance in explaining an arrangement of a cooling structure of a test head for IC tester according to a third embodiment of the present invention.
Figure 10:
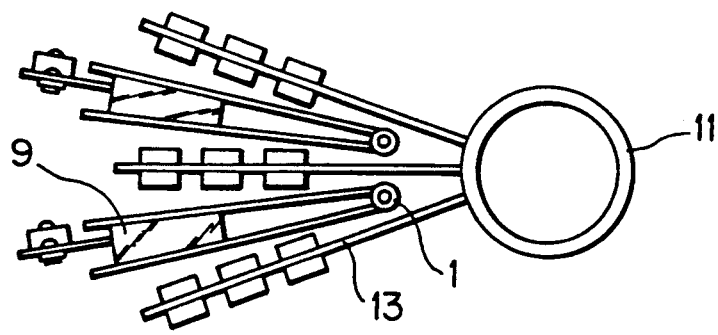

In FIG. 8, designated at 8 is a fixing table and 9 is a wedge shaped presser plate and 10 is the lever. The fixing table 8 and the lever 10 are connected to each other. At the state where the lever 10 stands as illustrated in FIG. 8, the paired cooling plates 3 can be detached from the IC 12 as illustrated in FIG. 10.

Figure 9:
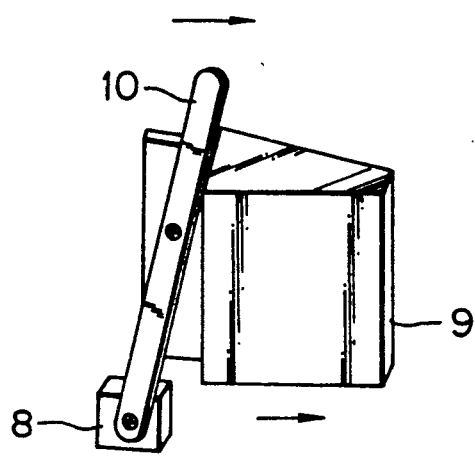
Figure 11:
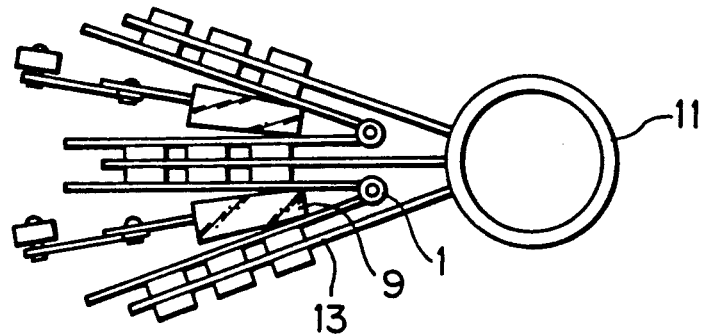
Figure 12:
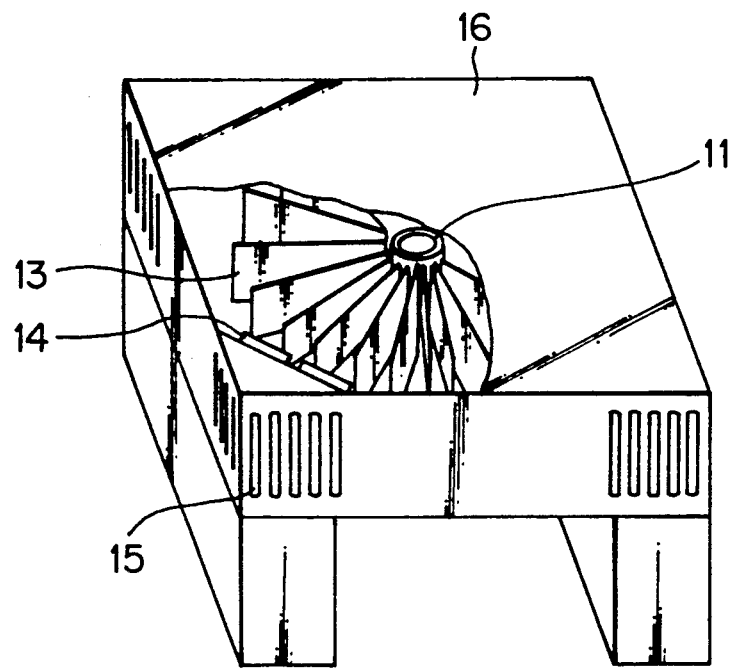
FIG. 12 is a view of assistance in explaining an arrangement of a prior art cooling structure.
Figure 13:
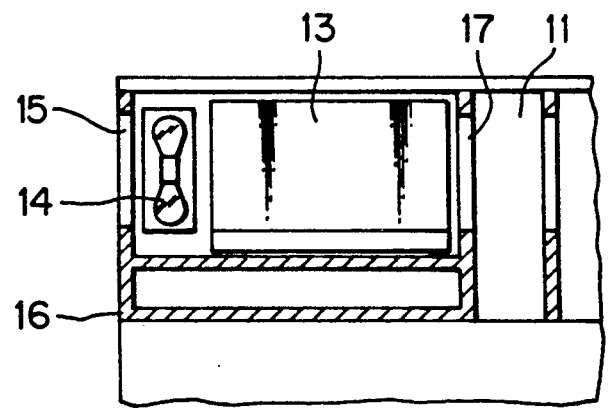
FIG. 13 is a cross sectional view of a main portion of FIG. 12.

In FIG. 9, when the lever 10 is brought down toward the hinge 1, the presser plate 9 moves toward the hinge 1 so that the presser plate 9 expands paired cooling plates 3 as illustrated in FIG. 11, thereby rendering the paired cooling plates 3 to contact the IC 12. Inasmuch as the paired cooling plates 3 contact the IC 12 mechanically, the contact between them can be maintained with assurance.

According to the present invention, inasmuch as the cooling structure of a test head for IC tester is capable of cooling ICs mounted on printed boards by providing a hinge between the printed boards disposed around a pipe 11, retaining cooling plates having a conduit by the hinge and flowing fluid having a large specific heat such as water into the counduit, the cooling efficiency can be improved compared with the air cooled type.

Furthermore, since the paired cooling plates can be opened or closed by the hinge, the maintenance of the cooling structure can be made with ease.

Although the invention has been described in its preferred form with a certain degree of paticularity, it is to be understood that many variations and changes are possible in the invention without departing from the scope thereof.

What is claimed is:

1. In a cooling structure of a test head for an IC tester including a pipe disposed at a central portion of the test head, and a plurality of printed boards disposed radially around the pipe and each provided with a plurality of ICs, the improvement comprising:

a hinge fixed between a plurality of said printed boards;

a plurality of paired cooling plates retained by the hinge at one end thereof and each provided with a conduit;

a plurality of thermal conductive plates each provided with a plurality of elastic projections; and the thermal conductive plates attached to the cooling plates and interposed between the paired cooling plates and the ICs and brought into contacting relationship therewith for rendering the ICs in thermal contact with the cooling plates by way of said elastic projections, and said conduits carrying therein liquid having a high specific heat.

2. A cooling structure according to claim 1, including an air cushion interposed between the paired cooling plates, said air cushion being expandable by the introduction of air therein to spread the paired cooling plates apart and thereby effect said contacting relationship of the thermal conductive plates relative to the cooling plates and the ICs.

3. A cooling structure according to claim 1, including a fixing plate interposed between the paired cooling plates, a wedge-shaped presser plate interposed between the paired cooling plates, and a lever operatively connecting the fixing plate to the presser plate, said presser plate being movable toward said hinge in response to operation of said lever to spread the paired cooling plates apart and thereby effect said contacting relationship of the thermal conductive plates relative to the cooling plates and the ICs.

* * * * *